United States Patent
Groe et al.

(10) Patent No.: US 7,522,005 B1
(45) Date of Patent: Apr. 21, 2009

(54) $K_{FM}$ FREQUENCY TRACKING SYSTEM USING AN ANALOG CORRELATOR

(75) Inventors: John B. Groe, Poway, CA (US); Kenneth Scott Walley, Carlsbad, CA (US)

(73) Assignee: Sequoia Communications, San Diego, CA (US)

( * ) Notice: Subject to any disclaimer, the term of this patent is extended or adjusted under 35 U.S.C. 154(b) by 75 days.

(21) Appl. No.: 11/829,828

(22) Filed: Jul. 27, 2007

Related U.S. Application Data

(60) Provisional application No. 60/834,199, filed on Jul. 28, 2006.

(51) Int. Cl.
*H03L 7/08* (2006.01)
*H03L 7/099* (2006.01)
*H03L 7/18* (2006.01)

(52) U.S. Cl. .................. 331/16; 331/1 A; 331/17
(58) Field of Classification Search ............ 331/1 A, 331/16–18, 25
See application file for complete search history.

(56) References Cited

U.S. PATENT DOCUMENTS

| | | | |
|---|---|---|---|
| 4,263,560 A | 4/1981 | Ricker | |
| 4,430,627 A | 2/1984 | Machida | |
| 4,769,588 A | 9/1988 | Panther | |
| 4,816,772 A | 3/1989 | Klotz | |
| 4,926,135 A | 5/1990 | Voorman | |
| 4,965,531 A | 10/1990 | Riley | |
| 5,006,818 A | 4/1991 | Koyama et al. | |
| 5,015,968 A | 5/1991 | Podell et al. | |
| 5,030,923 A | 7/1991 | Arai | |
| 5,289,136 A | 2/1994 | DeVeirman et al. | |
| 5,331,292 A | 7/1994 | Worden et al. | |
| 5,399,990 A | 3/1995 | Miyake | |
| 5,491,450 A | 2/1996 | Helms et al. | |
| 5,508,660 A | 4/1996 | Gersbach et al. | |
| 5,548,594 A | 8/1996 | Nakamura | |
| 5,561,385 A | 10/1996 | Choi | |
| 5,581,216 A | 12/1996 | Ruetz | |
| 5,625,325 A | 4/1997 | Rotzoll et al. | |
| 5,631,587 A | 5/1997 | Co et al. | |
| 5,648,744 A | 7/1997 | Prakash et al. | |
| 5,677,646 A | 10/1997 | Entrikin | |
| 5,739,730 A | 4/1998 | Rotzoll | |
| 5,767,748 A | 6/1998 | Nakao | |
| 5,818,303 A | 10/1998 | Oishi et al. | |
| 5,834,987 A | 11/1998 | Dent | |
| 5,862,465 A | 1/1999 | Ou | |
| 5,878,101 A | 3/1999 | Aisaka | |
| 5,880,631 A | 3/1999 | Sahota | |
| 5,939,922 A | 8/1999 | Umeda | |
| 5,945,855 A | 8/1999 | Momtaz | |
| 5,949,286 A | 9/1999 | Jones | |
| 5,990,740 A | 11/1999 | Groe | |
| 5,994,959 A | 11/1999 | Ainsworth | |
| 5,999,056 A | 12/1999 | Fong | |
| 6,011,437 A | 1/2000 | Sutardja et al. | |

(Continued)

*Primary Examiner*—David Mis
(74) *Attorney, Agent, or Firm*—Cooley Godward Kronish LLP

(57) ABSTRACT

An apparatus providing a phase/frequency modulation system is disclosed herein. The apparatus includes a first circuit configured to introduce an offset to center a signal applied to a VCO. The apparatus further includes a second circuit configured to set a gain of the VCO. A frequency tracking network is configured to dynamically adjust one or both of the offset and the gain.

7 Claims, 16 Drawing Sheets

FM Tracking Loop

Calibration System using Standard Correlator for Scaling Parameter α

U.S. PATENT DOCUMENTS

| | | | |
|---|---|---|---|
| 6,018,651 A | 1/2000 | Bruckert et al. | |
| 6,031,425 A | 2/2000 | Hasegawa | |
| 6,044,124 A | 3/2000 | Monahan et al. | |
| 6,052,035 A | 4/2000 | Nolan et al. | |
| 6,057,739 A | 5/2000 | Crowley et al. | |
| 6,060,935 A | 5/2000 | Shulman | |
| 6,091,307 A | 7/2000 | Nelson | |
| 6,100,767 A | 8/2000 | Sumi | |
| 6,114,920 A | 9/2000 | Moon et al. | |
| 6,163,207 A | 12/2000 | Kattner et al. | |
| 6,173,011 B1 | 1/2001 | Rey et al. | |
| 6,191,956 B1 | 2/2001 | Foreman | |
| 6,204,728 B1 | 3/2001 | Hageraats | |
| 6,211,737 B1 | 4/2001 | Fong | |
| 6,229,374 B1 | 5/2001 | Tammone, Jr. | |
| 6,246,289 B1 | 6/2001 | Pisati et al. | |
| 6,255,889 B1 | 7/2001 | Branson | |
| 6,259,321 B1 | 7/2001 | Song et al. | |
| 6,288,609 B1 | 9/2001 | Brueske et al. | |
| 6,298,093 B1 | 10/2001 | Genrich | |
| 6,333,675 B1 | 12/2001 | Saito | |
| 6,370,372 B1 | 4/2002 | Molnar et al. | |
| 6,392,487 B1 | 5/2002 | Alexanian | |
| 6,404,252 B1 | 6/2002 | Wilsch | |
| 6,476,660 B1 | 11/2002 | Visocchi et al. | |
| 6,515,553 B1 | 2/2003 | Filiol et al. | |
| 6,559,717 B1 | 5/2003 | Lynn et al. | |
| 6,560,448 B1 | 5/2003 | Baldwin et al. | |
| 6,571,083 B1 | 5/2003 | Powell, II et al. | |
| 6,577,190 B2 | 6/2003 | Kim | |
| 6,583,671 B2 | 6/2003 | Chatwin | |
| 6,583,675 B2 | 6/2003 | Gomez | |
| 6,639,474 B2 | 10/2003 | Asikainen et al. | |
| 6,664,865 B2 | 12/2003 | Groe et al. | |
| 6,683,509 B2 | 1/2004 | Albon et al. | |
| 6,693,977 B2 | 2/2004 | Katayama et al. | |
| 6,703,887 B2 | 3/2004 | Groe | |
| 6,711,391 B1 | 3/2004 | Walker et al. | |
| 6,724,235 B2 | 4/2004 | Costa et al. | |
| 6,734,736 B2 | 5/2004 | Gharpurey | |
| 6,744,319 B2 | 6/2004 | Kim | |
| 6,751,272 B1 | 6/2004 | Burns et al. | |
| 6,753,738 B1 | 6/2004 | Baird | |
| 6,763,228 B2 | 7/2004 | Prentice et al. | |
| 6,774,740 B1 | 8/2004 | Groe | |
| 6,777,999 B2 | 8/2004 | Kanou et al. | |
| 6,781,425 B2 | 8/2004 | Si | |
| 6,795,843 B1 | 9/2004 | Groe | |
| 6,798,290 B2 | 9/2004 | Groe et al. | |
| 6,801,089 B2 | 10/2004 | Costa et al. | |
| 6,845,139 B2 | 1/2005 | Gibbons | |
| 6,856,205 B1 | 2/2005 | Groe | |
| 6,870,411 B2 | 3/2005 | Shibahara et al. | |
| 6,917,791 B2 | 7/2005 | Chadwick | |
| 6,940,356 B2 | 9/2005 | McDonald, II et al. | |
| 6,943,600 B2 | 9/2005 | Craninckx | |
| 6,975,687 B2 | 12/2005 | Jackson et al. | |
| 6,985,703 B2 | 1/2006 | Groe et al. | |
| 6,990,327 B2 | 1/2006 | Zheng et al. | |
| 7,062,248 B2 | 6/2006 | Kuiri | |
| 7,065,334 B1 | 6/2006 | Otaka et al. | |
| 7,088,979 B1 | 8/2006 | Shenoy et al. | |
| 7,120,396 B2 * | 10/2006 | Wilson | 455/108 |
| 7,123,102 B2 | 10/2006 | Uozumi et al. | |
| 7,142,062 B2 | 11/2006 | Vaananen et al. | |
| 7,148,764 B2 | 12/2006 | Kasahara et al. | |
| 7,171,170 B2 | 1/2007 | Groe et al. | |
| 7,215,215 B2 | 5/2007 | Hirano et al. | |
| 2002/0071497 A1 | 6/2002 | Bengtsson et al. | |
| 2002/0135428 A1 | 9/2002 | Gomez | |
| 2002/0193009 A1 | 12/2002 | Reed | |
| 2003/0078016 A1 | 4/2003 | Groe et al. | |
| 2003/0092405 A1 | 5/2003 | Groe et al. | |
| 2003/0118143 A1 | 6/2003 | Bellaouar et al. | |
| 2003/0197564 A1 | 10/2003 | Humphreys et al. | |
| 2004/0017852 A1 | 1/2004 | Redman-White | |
| 2004/0051590 A1 | 3/2004 | Perrott et al. | |
| 2005/0093631 A1 | 5/2005 | Groe | |
| 2005/0099232 A1 | 5/2005 | Groe et al. | |
| 2006/0003720 A1 | 1/2006 | Lee et al. | |

* cited by examiner

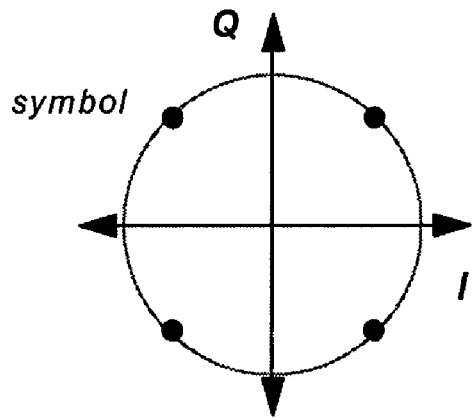
Figure 1. QPSK constellation diagram (Prior Art)
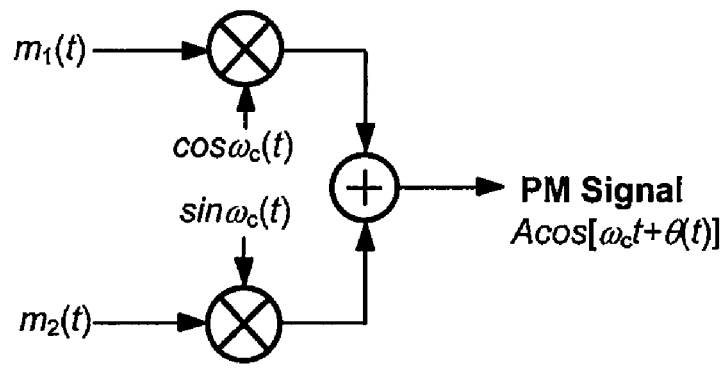
Figure 2. Typical I/Q modulator (Prior Art)
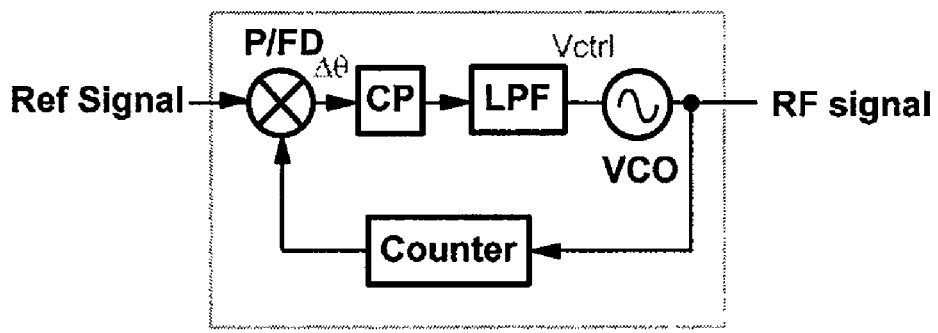
Figure 3. Conventional PLL (Prior Art)

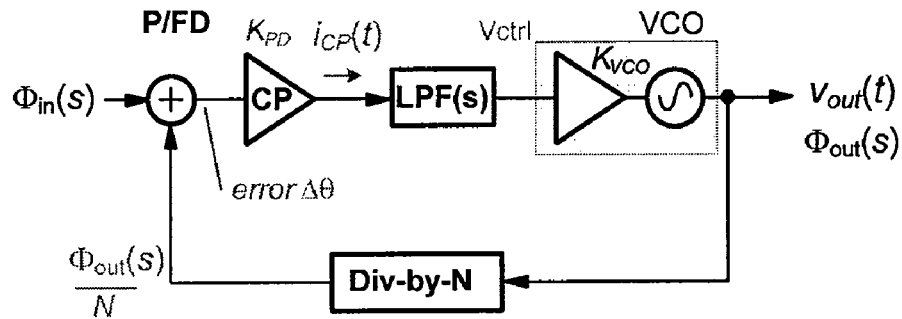
Figure 4. Mathematical Model of the PLL (Prior Art)
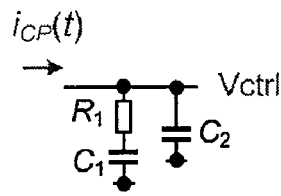
Figure 5. Integration Filter (Prior Art)
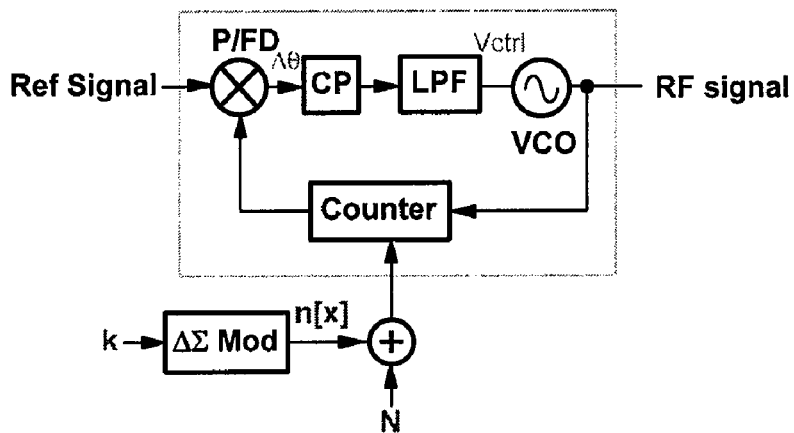
Figure (6a). Block Diagram of Fractional-N PLL using a ΔΣ modulator (Prior Art)

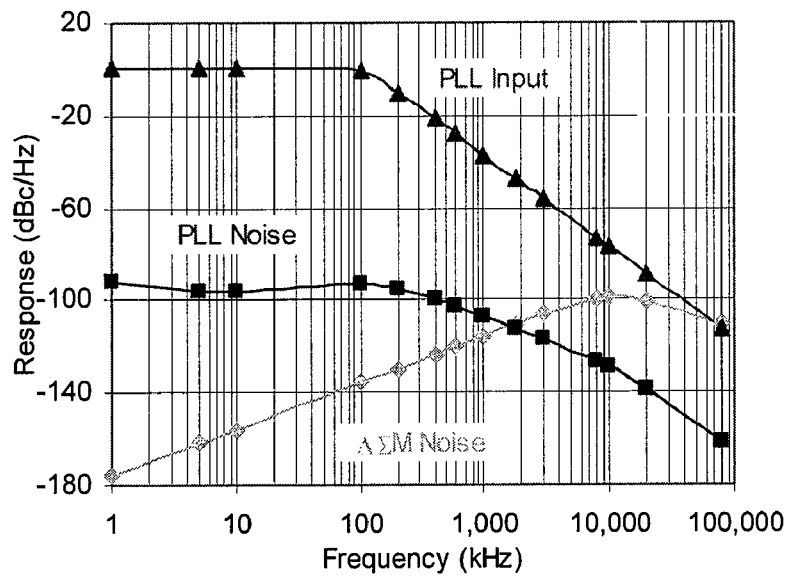
(6b)
Figures 6(b). Frequency Response of Fractional-N PLL using a ΔΣ modulator (Prior Art)
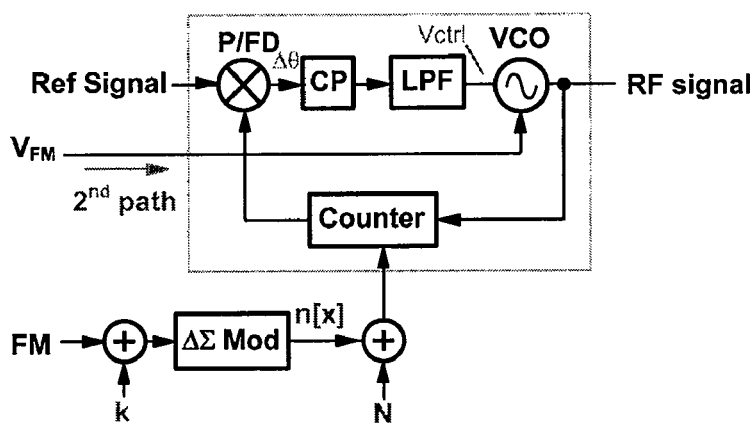
Figure (7a). Block Diagram of Direct Phase/Frequency Modulator

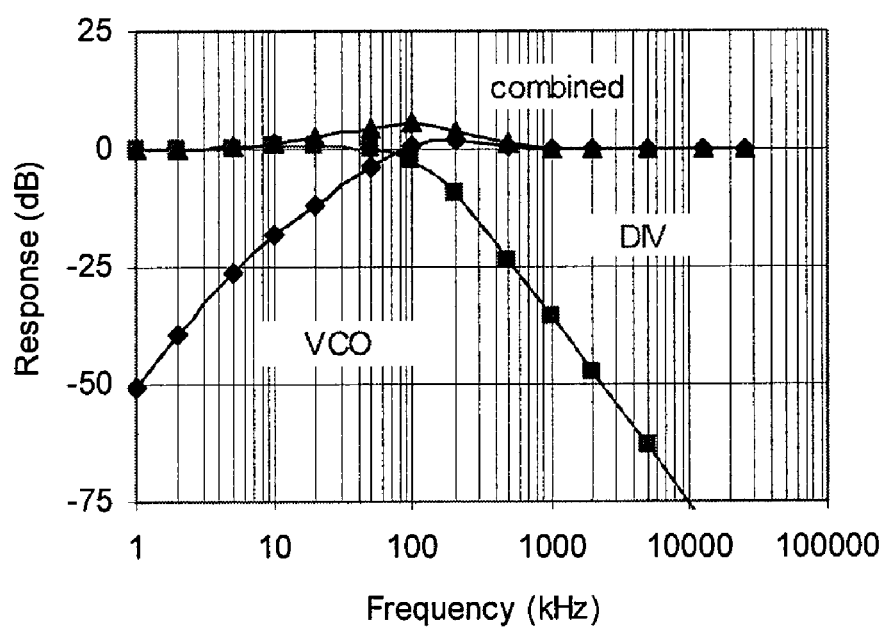
Figure (7b). Frequency Response of Direct Phase/Frequency Modulator

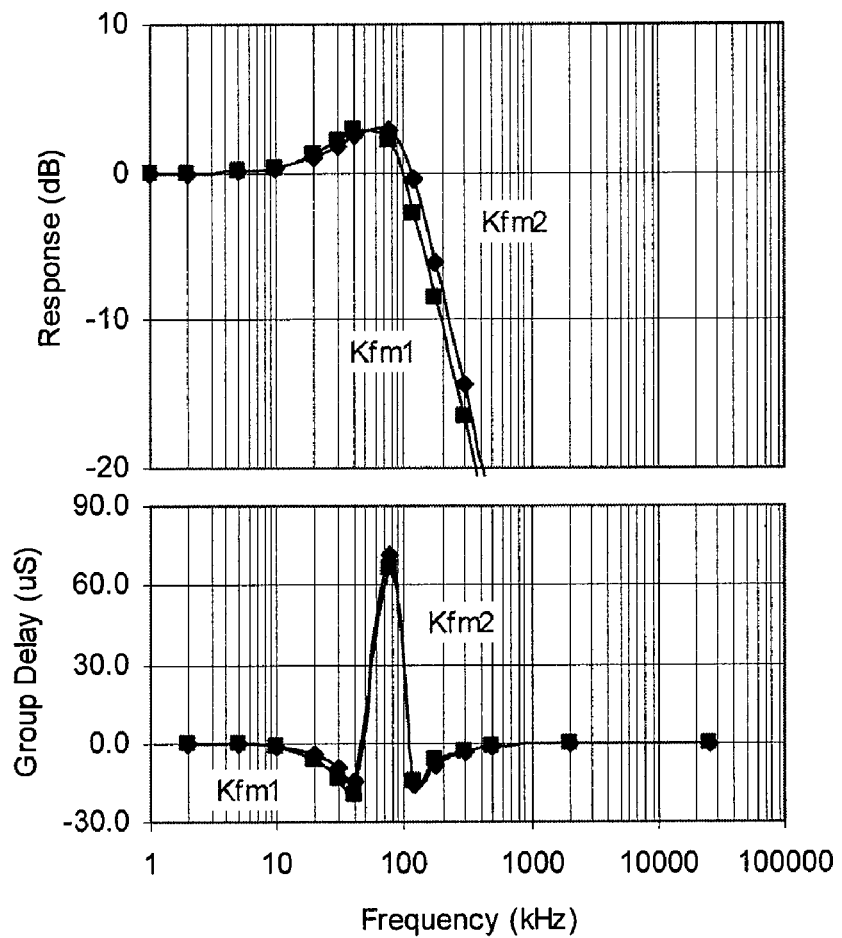
Figure (7c). Frequency Response with $K_{FM}$ Mismatch
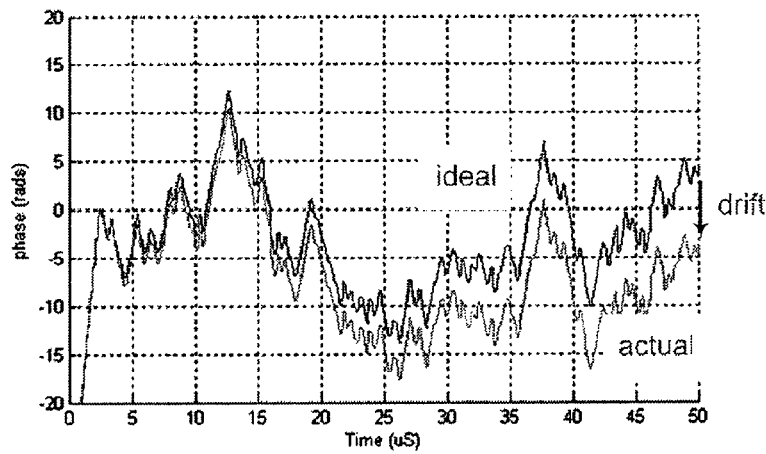
Figure (7d). Phase Drift with $K_{FM}$ Mismatch

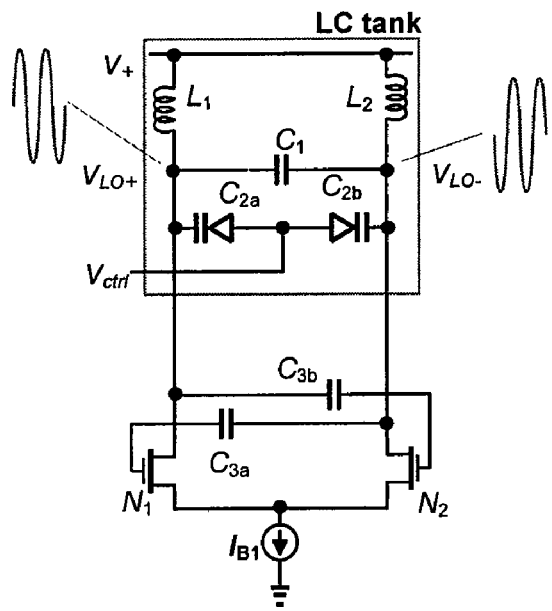
Figure (8a). Voltage-Controlled Oscillator (Prior Art)
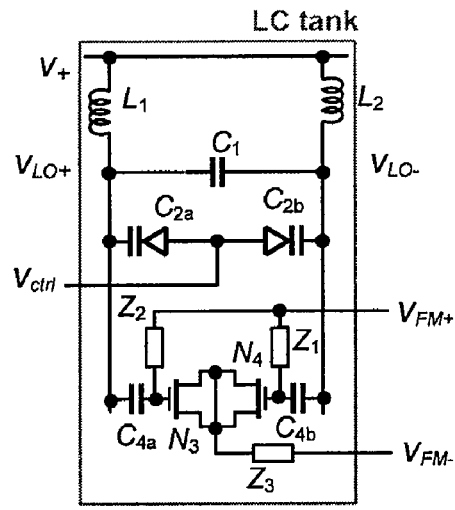
(8b)
Figures 8(b). FM Port Details of Voltage-Controlled Oscillator (Prior Art)

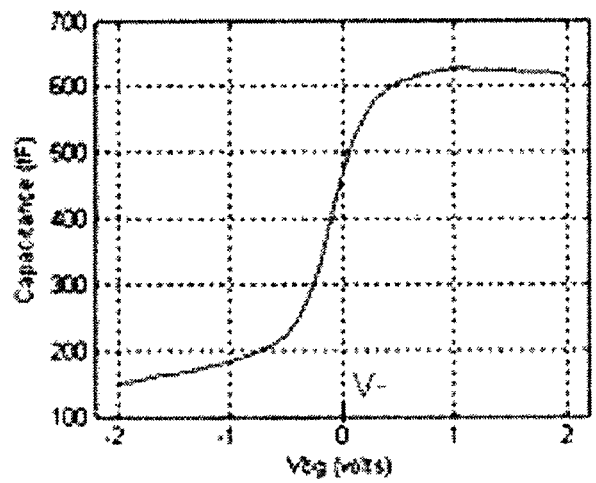
Figure (9a). C-V Relationship for Single Accumulation-Mode MOSFET Device
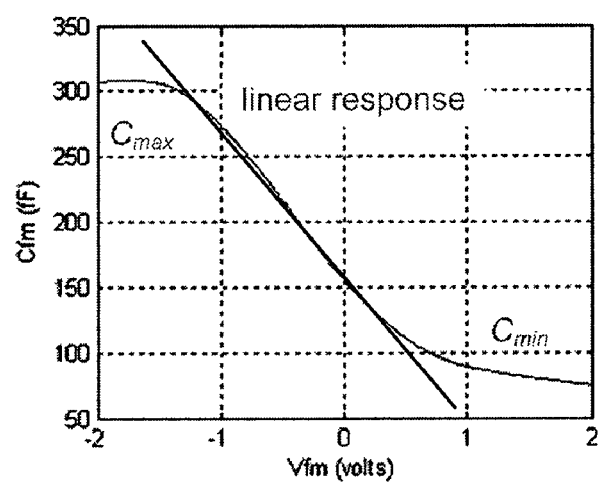
(9b)
Figures 9(b). C-V Relationship for Back-to-Back Devices

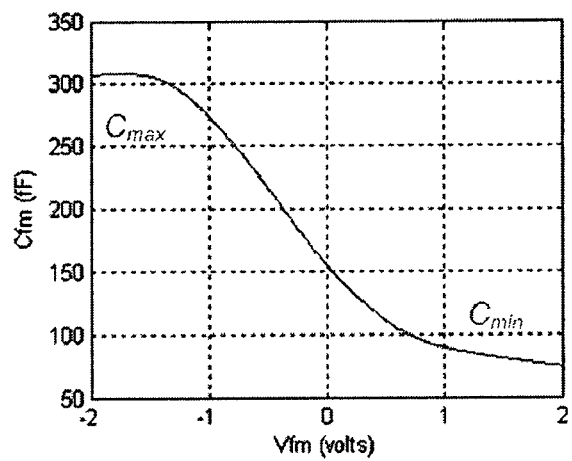
Figure (10a). Equivalent Series Capacitance $C_{FM}$ of the MOSFET Devices in the VCO
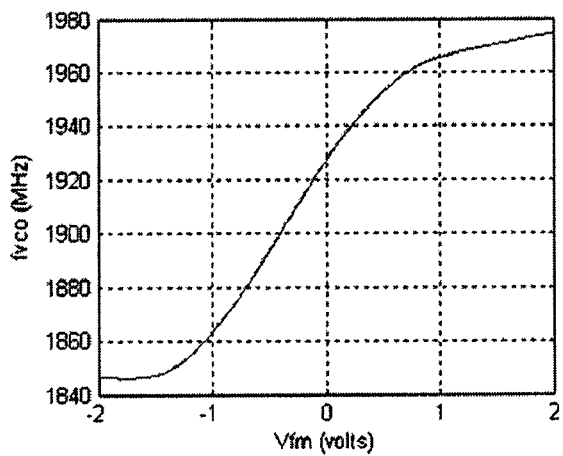
Figure (10b). Frequency Modulation Behavior of the MOSFET Devices in the VCO
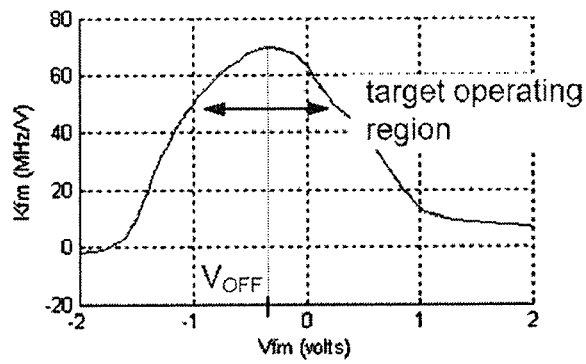
Figure (10c). Sensitivity $K_{FM}$ of the VCO

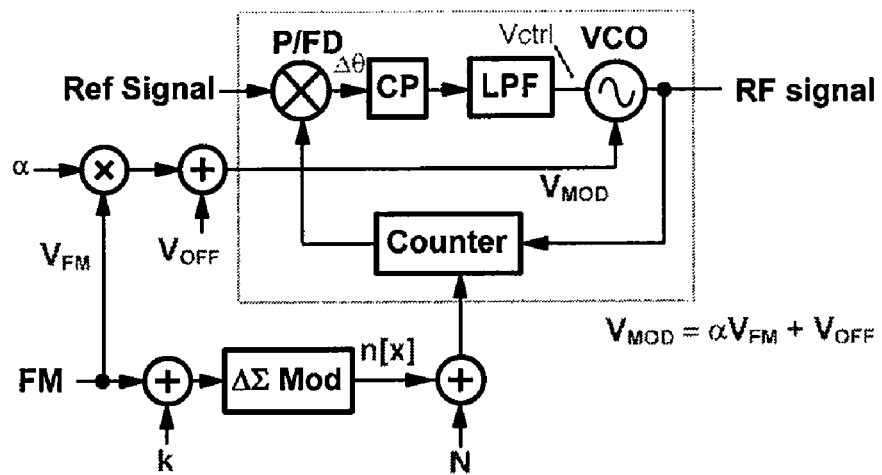
Figure 11. Direct Phase/Frequency Modulator with $K_{FM}$ Linearization
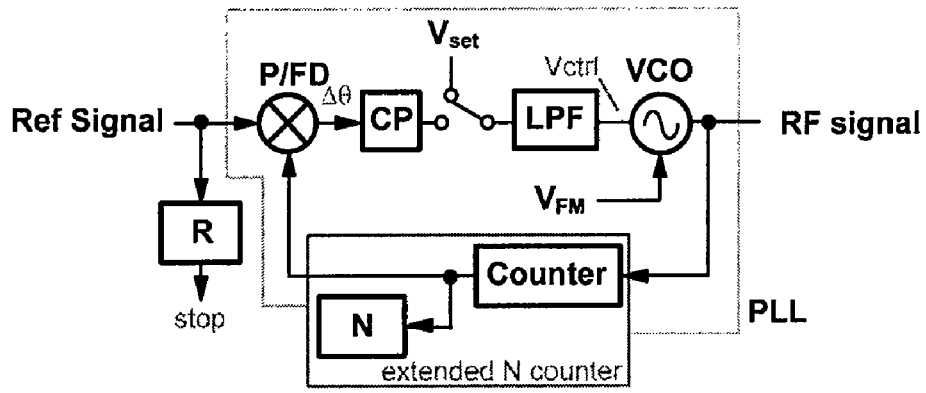
Figure 12. Initial Set-up of the Direct Phase/frequency Modulator
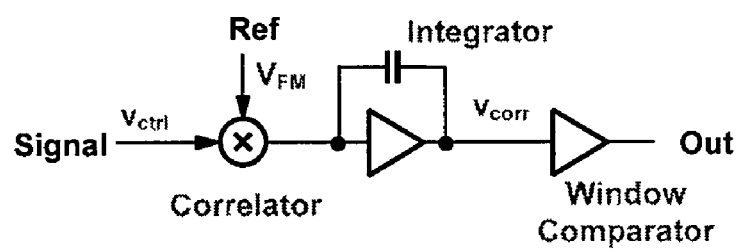
Figure 13. Correlator Network for Signal Detection

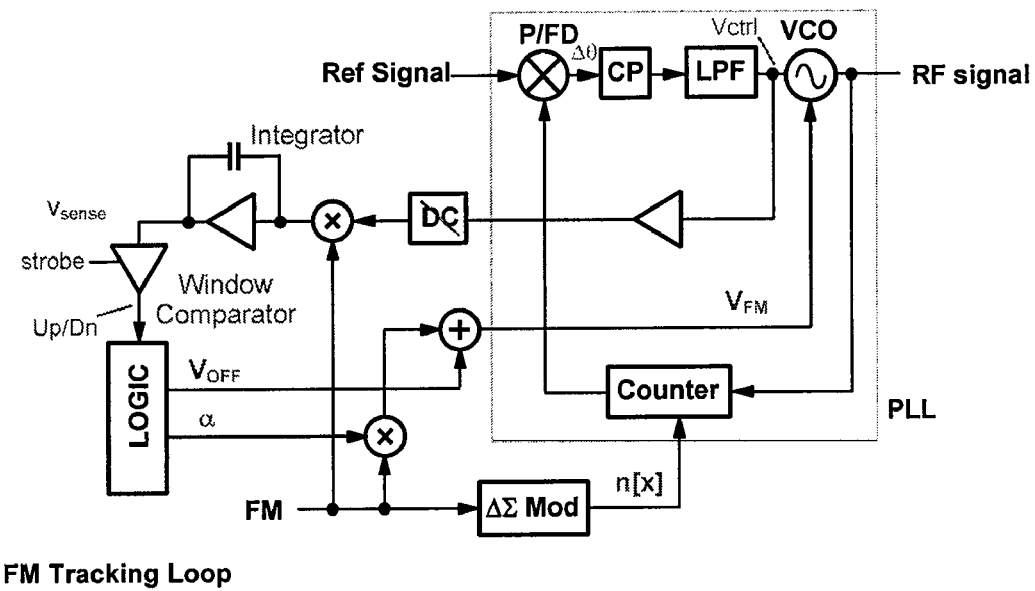
FM Tracking Loop
Figure (14a). Calibration System using Standard Correlator for Scaling Parameter $\alpha$
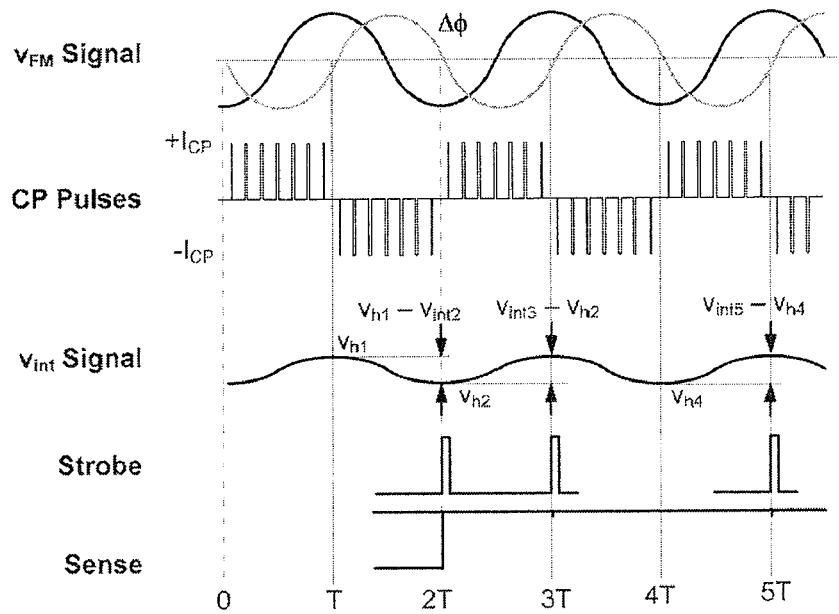
Figure (14b). Timing Diagram for Calibration System of Scaling Parameter $\alpha$

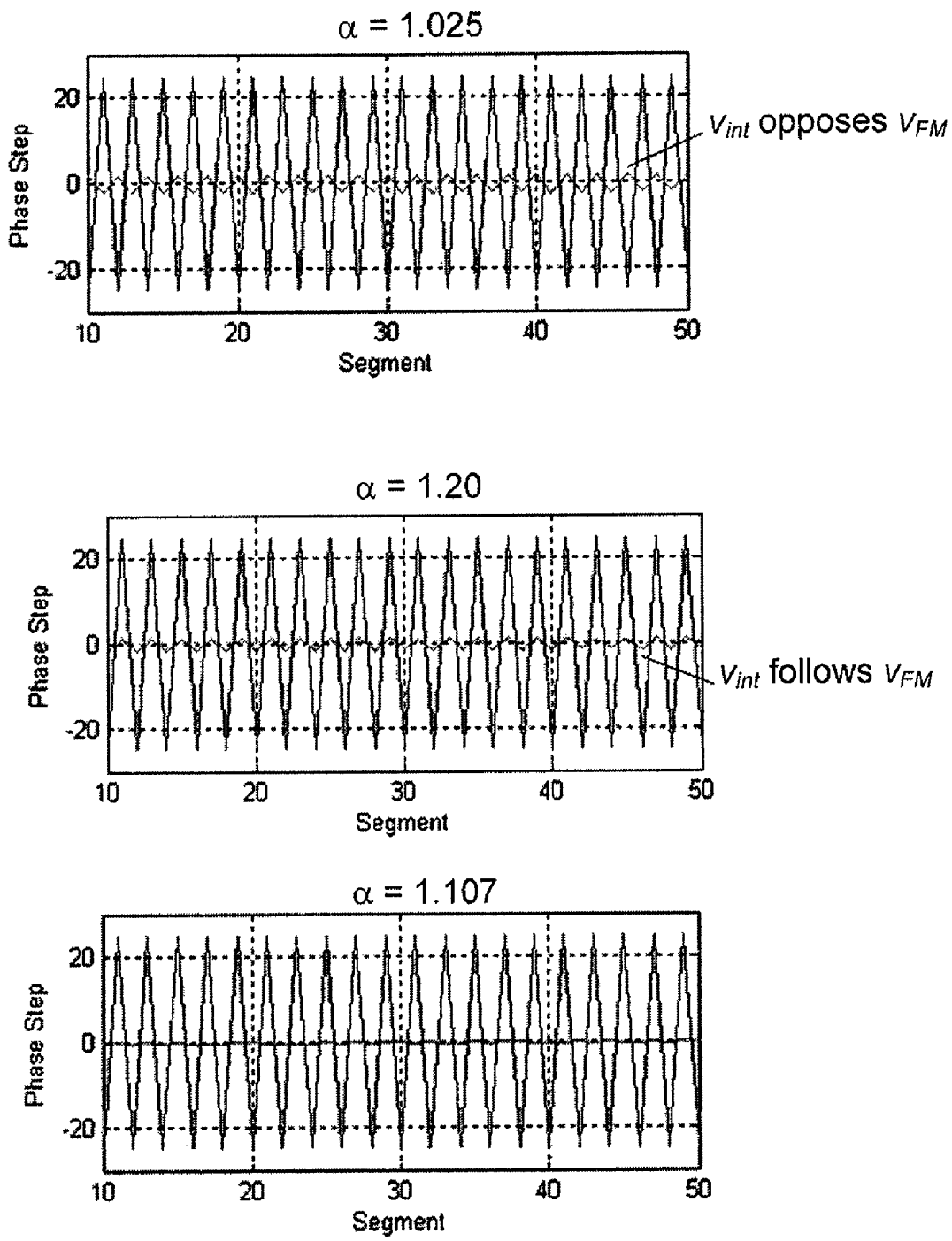
Figure (14c). Signals with Different $\alpha$ Values

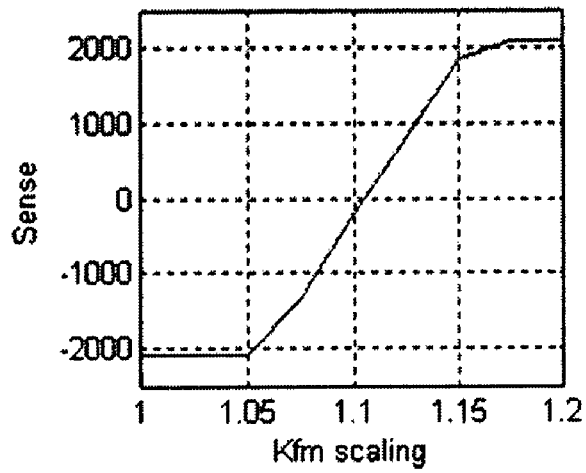
(14d)
Figure 14(d). Convergence Plot for Calibration System
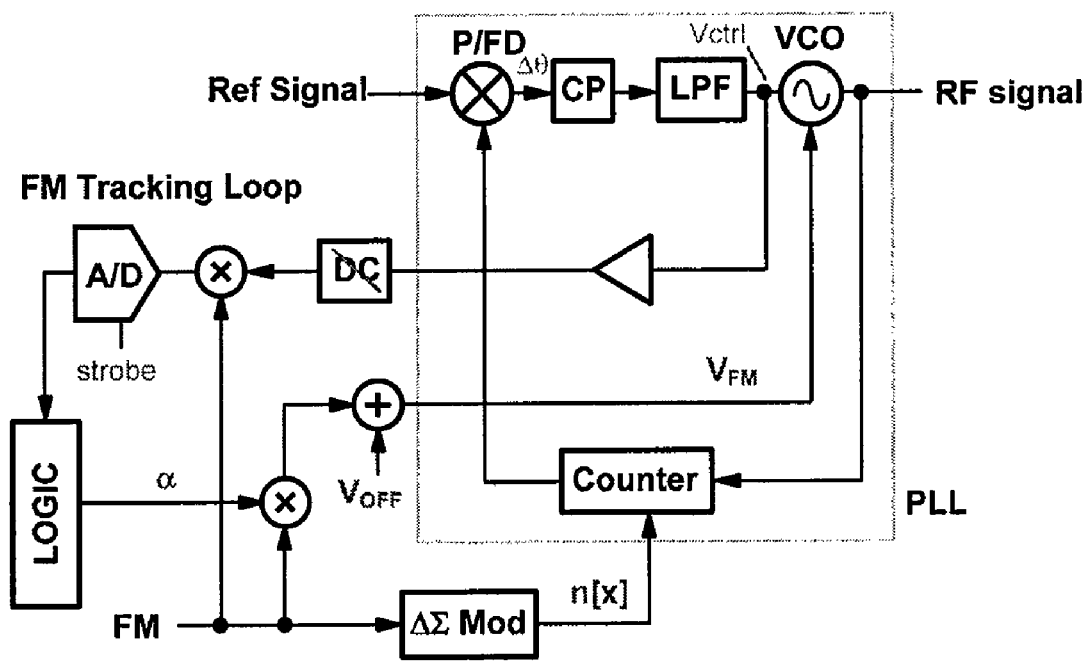
Figure 15. Calibration System using A/D Converter

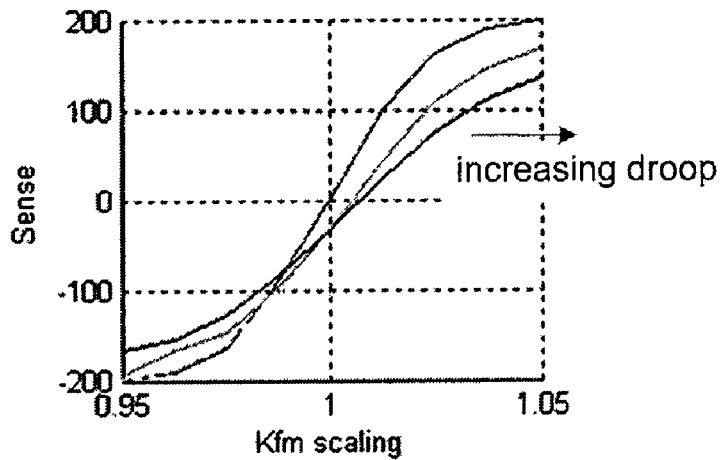
Figure 16. Effect of $K_{FM}$ Curvature on Scaling Parameter $\alpha$
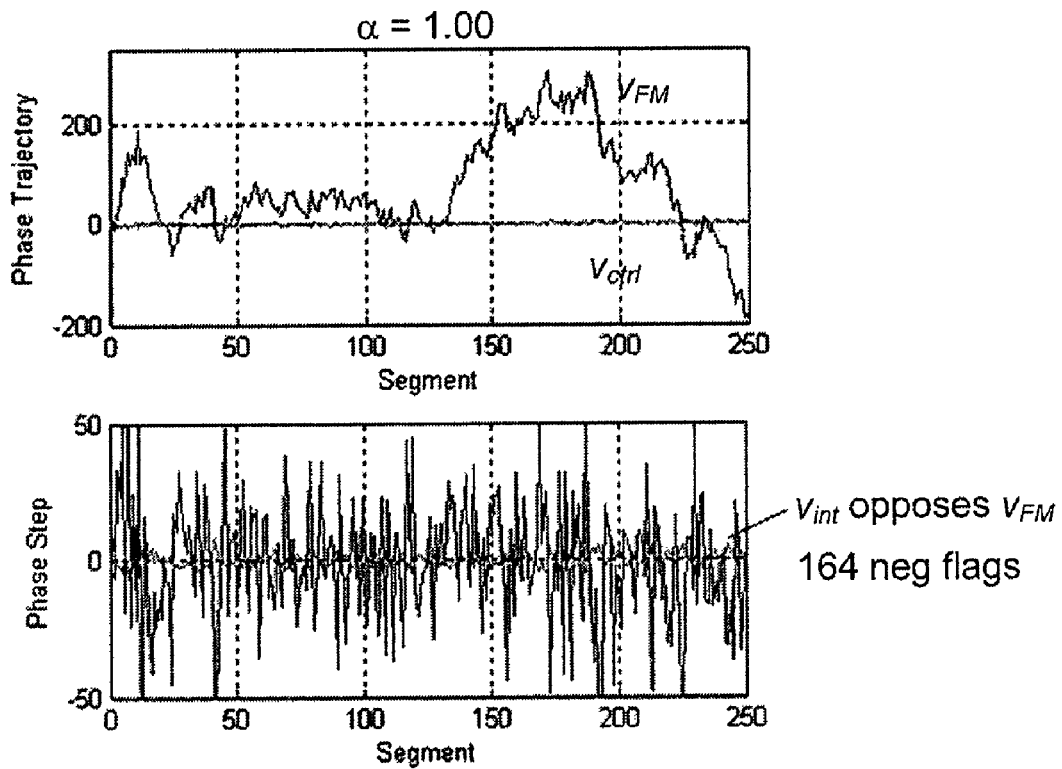
Figure (17a). Signals with Low $\alpha$ Value

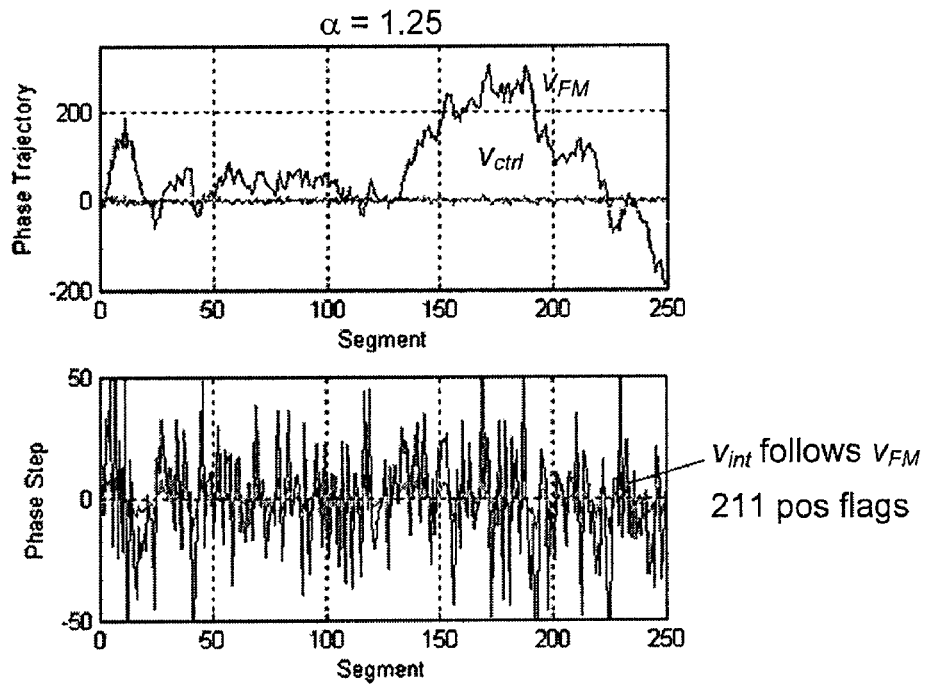
Figure (17b). Signals with High $\alpha$ Value
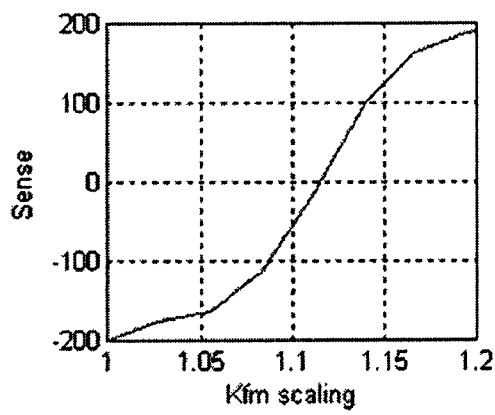
Figure (17c). Convergence of Tracking System with Direct Phase/Frequency Modulator configured for WCDMA RCC1

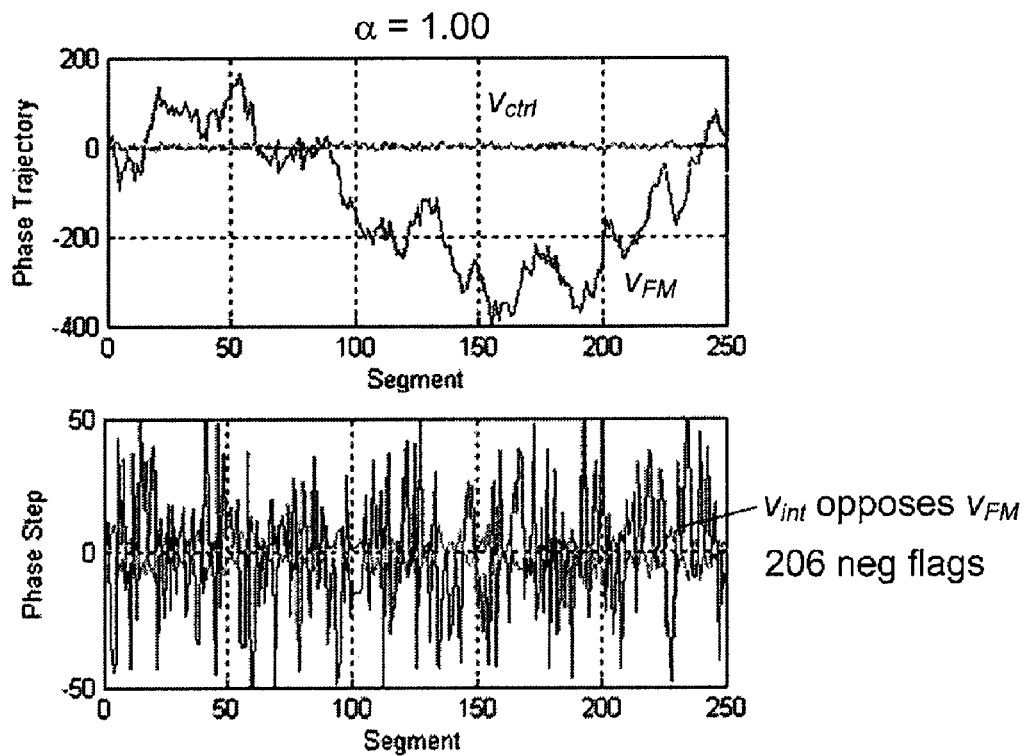
Figure (18a). Tracking System with Low $\alpha$ Value
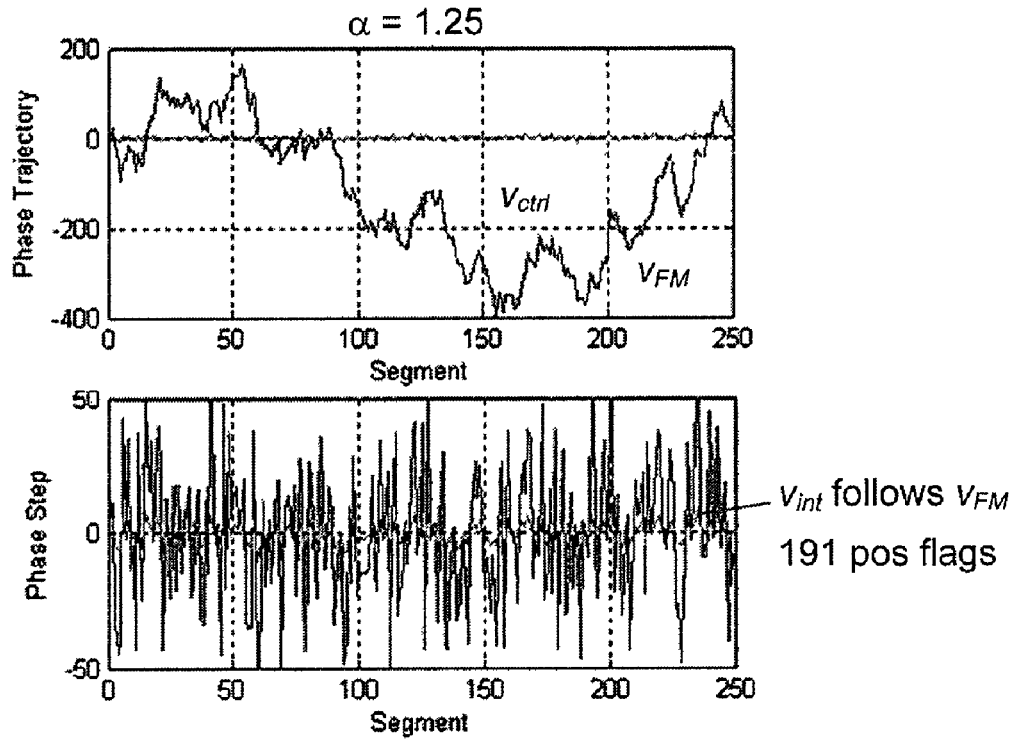
Figure (18b). Tracking System with High $\alpha$ Value

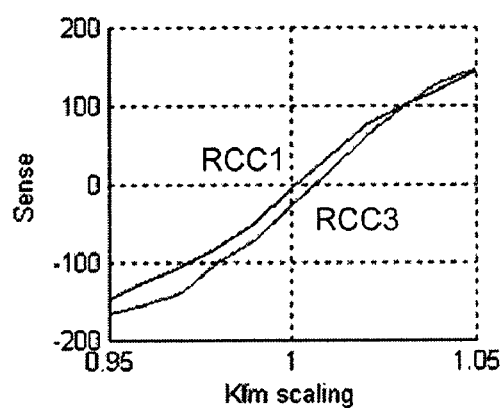
Figure (18c). Convergence of Tracking System with Direct Phase/Frequency Modulator configured for WCDMA RCC3 ic # $K_{FM}$ FREQUENCY TRACKING SYSTEM USING AN ANALOG CORRELATOR

CROSS-REFERENCE TO RELATED APPLICATIONS

This application claims priority under 35 U.S.C. §119(e) to U.S. Provisional Application Ser. No. 60/834,199, entitled KFM FREQUENCY TRACKING SYSTEM USING AN ANALOG CORRELATOR, filed Jul. 28, 2006, which is incorporated by reference herein for all purposes. This application is related to co-pending U.S. patent application Ser. No. 11/829,817 entitled $K_{FM}$ PHASE TRACKING SYSTEM USING A DIGITAL CORRELATOR, filed on even date herewith.

FIELD OF THE INVENTION

The present application relates generally to phase/frequency modulators, and more particularly, to a system for $K_{FM}$ frequency tracking using an analog correlator.

BACKGROUND OF THE INVENTION

Phase modulation schemes are very effective and are therefore widely used in communication systems. A simple example of a phase modulation scheme is quaternary phase shift keying (QPSK). FIG. 1 shows a constellation diagram that illustrates how QPSK maps two-bit digital data to one of four phase offsets. FIG. 2 shows a typical QPSK (or I/Q) modulator used to generate a phase-modulated signal. This technique relies on orthogonal signal vectors to realize the phase offsets—an inherently linear technique, since it depends solely on the matching of these orthogonal signals.

The I/Q modulator provides a straightforward approach to generating phase-modulated signals. However, it is also possible to generate the phase-modulated signals using a phase-locked loop. This approach offers reduced circuitry, lowers power consumption, and as a result, finds widespread use in narrowband systems. A variation of this approach, known as two-point modulation, introduces direct modulation of the VCO to support wideband phase modulation. Unfortunately, this requires the gain of the VCO to be accurately set—a difficult task since the VCO gain depends on multiple factors. It would therefore be advantageous to have a system that operates to accurately set the gain of a VCO.

SUMMARY OF THE INVENTION

In one or more embodiments, a very efficient system for wideband phase modulation is provided. The system operates to set the gain and offset parameters of a VCO within a phase modulation system, and then periodically adjust these parameters based on the operation of a frequency tracking loop.

One aspect of the invention relates to an apparatus providing a phase/frequency modulation system. The apparatus includes a first circuit configured to introduce an offset to center a signal applied to a VCO. The apparatus further includes a second circuit configured to set a gain of the VCO. A frequency tracking network is configured to dynamically adjust one or both of the offset and the gain.

In another aspect the invention pertains to an apparatus for tracking in a two point phase/frequency modulation system to adjust an offset and scale of a signal applied to a VCO of a phase-locked loop (PLL). The apparatus includes a correlator configured to project a PLL correction signal onto a reference modulation signal. The apparatus further includes an integrator for accumulating an output of the correlator. A window comparator determines a polarity of an output of the integrator. The apparatus also includes logic having a first counter configured to scale the signal applied to the VCO based on an output of the window comparator, and having a second counter configured to offset the signal applied to the VCO based on the output of the window comparator.

An aspect of the invention is also directed to an apparatus for tracking in a two point phase/frequency modulation system to adjust an offset and scale of a signal applied to a VCO. The apparatus includes a correlator operative to project a PLL correction signal onto a reference modulation signal and produce a correlation signal. An A/D converter produces a digital signal based upon the correlation signal. The apparatus also includes logic configured to compute a system error and to generate, based on the digital signal, a first output used in offsetting the signal applied to the VCO and a second output used in scaling the signal applied to the VCO.

In yet another aspect the invention relates to a phase/frequency modulation system. The system includes a phase-locked loop (PLL) having a VCO including a first port and a second port wherein during operation of the PLL an error signal is received by the first port. A correlator network is configured to track the error signal and produce an output signal. The system also includes a tracking loop which generates, in response to the output signal, a VCO control signal applied to the second port.

BRIEF DESCRIPTION OF THE DRAWINGS

The foregoing aspects and the attendant advantages of the embodiments described herein will become more readily apparent by reference to the following description when taken in conjunction with the accompanying drawings wherein:

FIG. 1 shows a constellation diagram that illustrates how QPSK maps two-bit digital data to one of four offsets;

FIG. 2 shows a diagram of a typical I/Q modulator;

FIG. 3 shows a PLL that is used to synthesize a radio frequency carrier signal;

FIG. 4 shows a mathematical model of the PLL shown in FIG. 3;

FIG. 5 shows an integration filter;

FIG. 6a shows one embodiment of a fractional-N PLL using a ΔΣ modulator;

FIG. 6b illustrates the frequency response of the fractional-N PLL shown in FIG. 6a;

FIG. 7a illustrates one embodiment of a fractional-N PLL that supports direct frequency or phase modulation;

FIG. 7b illustrates the frequency response of the direct phase/frequency modulator shown in FIG. 7a;

FIG. 7c illustrates the effect on the frequency response of the two point frequency modulator shown in FIG. 7a with unmatched VCO gain $K_{FM}$;

FIG. 7d illustrates the time domain impact when the two point frequency modulator shown in FIG. 7a operates with unmatched VCO gain $K_{FM}$;

FIG. 8a shows a detailed view of a voltage-controlled oscillator;

FIG. 8b shows one embodiment of a VCO tank circuit that includes an auxiliary port to support linear phase/frequency modulation;

FIG. 9a shows the capacitance-voltage relationship for an accumulation-mode MOSFET device;

FIG. 9b shows the linear capacitance-voltage response from back to back MOSFET devices;

FIG. 10a shows the equivalent series capacitance of the back-to-back MOSFET devices within the VCO detailed in FIG. 8;

FIG. 10b shows the frequency modulation resulting from the control of the back-to-back MOSFET devices in the VCO of FIG. 8;

FIG. 10c shows the VCO gain $K_{FM}$ sensitivity for the VCO in FIG. 8;

FIG. 11 illustrates the direct phase/frequency modulator with an adjustable VCO offset and gain $K_{FM}$;

FIG. 12 shows a block diagram of the system used to initially set the parameters of the direct phase/frequency modulator;

FIG. 13 shows a simplified block diagram of a correlator network included within the $K_{FM}$ tracking system of the present invention;

FIG. 14a shows a diagram of an embodiment of a calibration system for calibrating the scaling parameter α and the VCO gain $K_{FM}$ associated with the FM port of the VCO using the correlator network of FIG. 13;

FIG. 14b illustrates the timing associated with the calibration system of FIG. 14a;

FIG. 14c illustrates the signals generated by the PLL of FIG. 14a with different a scaling parameters;

FIG. 14d illustrates the convergence of the calibration system of FIG. 14a;

FIG. 15 shows a block diagram of an embodiment of the calibration system of FIG. 14a using an A/D converter instead of an analog window comparator;

FIG. 16 shows the effect of $K_{FM}$ curvature on the scaling parameter a as determined by the calibration systems shown in FIG. 14a and FIG. 15;

FIG. 17a shows the operation of the tracking system for WCDMA RCC1 data with α set low;

FIG. 17b shows the operation of the tracking system for WCDMA RCC1 data with α set high;

FIG. 17c illustrates the convergence of the tracking system of FIG. 14a with WCDMA RCC1 data;

FIG. 18a shows the operation of the tracking system for WCDMA RCC3 high-speed data with α set low;

FIG. 18b shows the operation of the tracking system for WCDMA RCC3 high-speed data with a set high; and FIG. 18c illustrates the convergence of the tracking system of FIG. 14a with WCDMA RCC3 high-speed data.

DETAILED DESCRIPTION OF EMBODIMENTS OF THE INVENTION

A phase-locked loop (PLL) comprising a voltage-controlled oscillator (VCO), feedback counter (counter), phase/frequency detector (P/FD), charge pump (CP), and integration filter (LPF) is shown in FIG. 3. It is described by the mathematical model shown in FIG. 4.

The phase-locked loop uses feedback to minimize the phase difference between a very accurate reference signal and the PLL's output signal. As such, the PLL produces an output signal at a frequency given by;

$$f_{VCO} = Nf_{REF}$$

where $f_{vco}$ is the frequency of the VCO output signal, N is the value of the feedback counter, and $f_{REF}$ is the frequency of the reference signal.

The VCO produces an output signal at a frequency set by the control voltage $v_{ctrl}$ according to;

$$v_{out}(t) = A\cos(\omega_o t + K_{vco}\int V_{ctrl}(t)dt)$$

where $\omega_o$ is the free-running frequency of the VCO and $K_{vco}$ is its associated gain. The gain $K_{vco}$ describes the relationship between the excess phase of the carrier $\Phi_{out}$ and the control voltage $v_{ctrl}$ with;

$$\frac{\Phi_{out}(s)}{v_{ctrl}(s)} = \frac{K_{vco}}{s}$$

where $K_{vco}$ is in radians/V. The VCO drives the feedback counter, which divides the output phase $\Phi_{out}$ by N. When the phase-locked loop is stable, the phase detector and charge pump circuits generate an output signal $i_{CP}$ that is proportional to the phase difference $\Delta\theta$ between the two signals applied to the phase detector. The output signal $i_{CP}$ can therefore be expressed as;

$$i_{CP}(s) = K_{pd}\frac{\Delta\theta(s)}{2\pi}$$

where $K_{pd}$ is in A/radians and $\Delta\theta$ is in radians.

A simple integration filter, comprising resistor $R_1$ and capacitors $C_1$-$C_2$ as shown in FIG. 5, transforms the output signal $i_{CP}$ to the control voltage $v_{ctrl}$ as follows;

$$v_{ctrl}(s) = i_{CP}(s)Z(s) = i_{CP}(s)\left(\frac{sR_1C_1 + 1}{s^2R_1C_1C_2 + s(C_1+C_2)}\right)$$

where a zero (at $1/R_1C_1$) has been added to stabilize the second order system and the capacitor $C_2$ has been included to reduce any ripple on the control voltage. Combining the above relations yields the closed-loop response of the system to an input signal as follows.

$$T_1(s) = \frac{NK_{PD}K_{VCO}Z(s)}{sN + K_{PD}K_{VCO}Z(s)}.$$

In a PLL, the feedback counter value N effectively sets the output frequency. In practice, its digital structure restricts N to integer numbers. As a result, the frequency resolution (or frequency step size) of an integer-N PLL is nominally set by $f_{REF}$. Fortunately, it is possible to dramatically decrease the effective frequency step by manipulating the value of N to yield a non-integer average value. This is the concept of the fractional-N PLL.

A fractional-N PLL that uses a $\Delta\Sigma$ modulator to develop non-integer values of N is shown in FIG. 6a. The $\Delta\Sigma$ modulator advantageously pushes spurious energy (created by the changing values of the feedback counter) to higher frequencies where it can be more effectively attenuated by the PLL's integration filter. It can be shown that the effective value of N is the average value described by;

$$N = \frac{\sum_{x=1}^{P} N[x]}{P}$$

where N[x] is the sequence of feedback counter values. This expands to;

$$N[x] = N_{int} + n[x]$$

where $N_{int}$ is the integer part and $n[x]$ is the fractional part of $N[x]$. The $\Delta\Sigma$ modulator generates the sequence $n[x]$ that satisfies;

$$\frac{\sum_{x=1}^{P} n[x]}{P} = \frac{k}{M}$$

where k is the input to the $\Delta\Sigma$ modulator with resolution M.

The $\Delta\Sigma$ modulator introduces quantization noise that appears at the PLL output. The pseudo-random sequence $n[x]$ possesses a quantization error equal to $\pm\frac{1}{2}$ around N or;

$$\Delta = \frac{1}{N}$$

It follows that the quantization noise spectral density for this error, assuming a uniform distribution, is expressed by;

$$e_{rms}^2(f) = \frac{1}{6N^2 f_{REF}}$$

over the frequency range of dc to $f_{REF}/2$. This quantization noise is advantageously shaped by an $L^{th}$ order $\Delta\Sigma$ modulator according to;

$$DS(z) = (1-z^{-1})^L$$

In the PLL system, the feedback counter acts as a digital accumulator and reduces the effects of the $\Delta\Sigma$ modulator. That is, the output phase from the feedback counter depends on its previous output phase. As a result, the transfer function for the feedback counter (or prescaler as it is sometimes referred) is therefore.

$$P(z) = 2\pi \frac{z^4}{1-z^{-1}}$$

Combining the above terms shows that the noise at the output of the feedback counter is equal to;

$$n^2(f) = e_{rms}^2(f)[DS(f)]^2[P(f)]^2$$

which yields;

$$n^2(f) = \frac{2}{3} \frac{\pi^2}{N^2 f_{REF}} \left[ 2\sin\left(\frac{\pi f}{f_{REF}}\right) \right]^{2(L-1)}$$

This noise seen at the output of the feedback counter is in turn shaped by the PLL transfer function $T_1(s)$.

It is possible to use a fractional-N PLL as a very efficient phase/frequency modulator. That's because signals applied to the $\Delta\Sigma$ modulator's input control and actually modulate the frequency of the VCO according to;

$$f_{VCO} = f_c + \Delta f(t) = (N_{int} + n[x]) f_{REF}$$

where $\Delta f(t)$ is the frequency modulation equal to;

$$\Delta f(t) = \left(n[x] - \frac{k}{M}\right) f_{REF} = FM f_{REF}$$

and FM is the applied modulation signal. In practice, the modulation is shaped by the PLL response described by transfer function $T_1(s)$. The PLL's response generally limits the bandwidth of the system so as to attenuate the $\Delta\Sigma$ modulator's quantization noise. This is illustrated in FIG. 6b. Consequently, this phase/frequency modulation approach supports only narrowband signals.

To overcome this bandwidth limitation, a second high-frequency modulation path is added to the VCO of the phase-locked loop, as shown in FIG. 7a. The resulting two-point frequency modulation system now displays a second and complimentary transfer function given by;

$$T_2(s) = \frac{sNK_{FM}}{sN + K_{PD}K_{VCO}Z(s)} v_{FM}$$

where $K_{FM}$ is the gain of the VCO port at which the $v_{FM}$ modulating signal is applied. Ideally, the two transfer function expressions ($T_1$ and $T_2$) combine to yield a flat and uniform response as illustrated in FIG. 7b. This occurs when;

$$FM f_{REF} = K_{FM} v_{FM}$$

The challenge with two-point modulation and specifically direct VCO modulation is that it may require near exact control of the VCO's frequency and consequently the product $K_{FM} v_{FM}$. This is illustrated in FIGS. 7c and 7d. Any frequency errors produce phase deviations that accumulate with time. Fortunately, the PLL's feedback helps to reduce these frequency errors. This occurs because the VCO output is driven by the PLL's feedback and can be expressed as;

$$f_{VCO} = N f_{REF} + FM_{REF}$$

which is also substantially equal to;

$$f_{VCO} = K_{VCO} v_{ctrl} + K_{FM} v_{FM}$$

where $v_{ctrl}$ is the error signal produced by the phase/frequency detector and $v_{FM}$ is the FM signal applied to the VCO. Consequently, the error signal $v_{ctrl}$ compensates for any VCO gain errors within the bandwidth of the PLL's integration filter. Outside the PLL's bandwidth, the effect of the feedback decreases. This may make setting the VCO's gain $K_{FM}$ to its designed value an issue for wideband modulation.

The gain of the VCO depends heavily on the circuit structure. FIG. 8a shows a detailed view of a typical VCO. It oscillates at a frequency set by the resonance of the LC tank circuit;

$$f_{osc} = \frac{1}{2\pi \sqrt{(L_1 + L_2) C_{eq}}}$$

where $C_{eq}$ is the equivalent shunt capacitance (comprised of capacitor $C_1$ and varactors $C_{2a}$-$C_{2b}$ plus any parasitic capacitance). The equivalent capacitance $C_{eq}$ may also include coarse-tuning capacitors (not shown) to subdivide the tuning range. The varactor $C_2$ (shown as $C_{2a}$ and $C_{2b}$) allows the VCO—by way of the control signal $v_{ctrl}$—to be tuned to different radio frequencies. The varactor can be realized various ways.

A VCO tank circuit that includes an auxiliary port to support linear phase/frequency modulation ($v_{FM}$ input) is shown in FIG. 8b. It uses the capacitance of accumulation-mode MOSFET devices $N_3$ and $N_4$ to achieve linear behavior even though these devices display an abrupt response as illustrated in FIG. 9a. The accumulation-mode MOSFET device presents a low capacitance $C_{min}$ at applied gate-to-bulk voltages $V_{GB}$ below the threshold voltage $V_T$ while it displays a high capacitance $C_{max}$ at applied voltages above $V_T$. (In the graph, $V_T$ equals 0) Capacitors $C_{4a}$ and $C_{4b}$ block the dc level present at the VCO output. Resistors $Z_1$-$Z_3$ provide some isolation between MOSFETs $N_3$-$N_4$ and the $v_{FM}$ signal.

The gate-to-bulk voltage $V_{GB}$ applied to each MOSFET device $N_3$-$N_4$ depends on the oscillator's output signal $A\sin\omega t$, the modulation signal $v_{FM}$, and the common-mode voltage $v_{cm}$. The symmetric structure of the VCO means signals $V_{LO+}$ and $V_{LO-}$ are differential with;

$$V_{LO+} = A\sin\omega t \quad V_{LO-} = -A\sin\omega t$$

where A is the peak signal of each sinusoidal output and $\omega$ is the oscillation frequency. It follows then that;

$$V_{C3} = A\sin\omega t + v_{FM} - v_{cm} \quad V_{C4} = -A\sin\omega t + v_{FM} - v_{cm}$$

which describe the gate-to-bulk voltages $V_{GB}$ applied to MOSFET devices $N_3$ and $N_4$. The two MOSFET devices connect back-to-back in the VCO tank circuit, so their individual capacitances behave oppositely.

The modulation signal $v_{FM}$ affects the MOSFET devices as follows. The devices nominally present a capacitance equal to;

$$C_{mid} = C_{FM}(v_{FM} = 0) = \frac{C_{min}C_{max}}{C_{min} + C_{max}}$$

when $v_{FM}$ equals zero. As the modulation signal $v_{FM}$ moves positive, both MOSFET devices spend more time at their maximum capacitance values $C_{max}$, so that for a time (t) approximately equal to;

$$t = \frac{1}{\omega}\sin^{-1}\left(-\frac{v_{FM}}{A}\right)$$

the structure presents a capacitance equal to $C_{max}/2$. A similar response occurs as the signal $v_{FM}$ moves negative, where the structure spends an increasing time at $C_{min}/2$. As a result, this back-to-back structure linearizes the overall response of the accumulation-mode MOSFETs to yield the behavior shown in FIG. 9b.

In the above analysis, the common-mode voltage $v_{cm}$ is assumed to be ac ground. This introduces some error as the signal, $v_{cm}$, although small, is actually non-zero. The differential voltage $\Delta V$ (which equals $V_{LO+} - V_{LO-}$) applied to the back-to-back MOSFET devices is simply $2A\sin\omega t$ and is independent of each device's capacitance, $C_3$ and $C_4$. It has already been shown that the voltages applied to each individual MOSFET device do not track and their capacitances change oppositely. This affects the common mode voltage Vcm according to the expression;

$$v_{cm}(t) = A\sin\omega t - \Delta V\left(\frac{C_4}{C_3 + C_3}\right)$$

which simplifies to;

$$v_{cm}(t) = A\sin\omega t\left[1 - 2\left(\frac{C_4}{C_3 + C_4}\right)\right]$$

Note that the bracketed term possesses the same sign as $A\sin\omega t$. This is because $C_4 < C_3$ when $\sin\omega t$ is positive and $C_4 > C_3$ when $\sin\omega t$ is negative. As a result, the second harmonic of $A\sin\omega t$ appears attenuated at the common-mode point. This tends to reduce positive values of the modulation signal $v_{FM}$ and expand negative values of the modulation signal, further linearizing the behavior of the back-to-back structure.

In the above analysis, it is also assumed that capacitors $C_{4a}$ and $C_{4b}$ are much larger than $C_{max}$. This allows most of the VCO output signal $2A\sin\omega t$ to appear across MOSFETs $N_3$ and $N_4$. Otherwise, $\Delta V$ would change with the capacitance of the MOSFET devices.

FIG. 10a shows a graph that illustrates the average capacitance $C_{FM}$ of the back-to-back MOSFET devices for different values of modulation signal $v_{FM}$. As expected, it spans from $C_{min}/2$ to $C_{max}/2$ and equals $C_{mid}$ at zero. This variable capacitance shifts the resonant frequency of the VCO's LC tank as shown in FIG. 10b. The frequency shift appears linear, but its derivative;

$$K_{FM} = \frac{d}{dv_{FM}}f_{VCO}$$

shows otherwise. The derivative (which is equivalent to the VCO gain $K_{FM}$), shown in FIG. 10c, reveals two problems. First, the peak VCO gain lies off center at an offset voltage $v_{OFF}$. This is because $C_{mid}$ lies closer to $C_{max}/2$ than $C_{min}/2$. This introduces asymmetry in the curve and potentially leads to a phase error that grows over time as illustrated in FIG. 7d. Second, the VCO gain $K_{FM}$ decreases as the modulation signal $v_{FM}$ increases. This is caused by the $\sin^{-1}$ function in the formula for the time that each MOSFET device spends at $C_{min}$ or $C_{max}$. It follows that the VCO gain can be approximated by the $2^{nd}$ order expression;

$$K_{FM}(v_{FM}) = K_{pk} - K_1(v_{FM} - v_{OFF})^2$$

where $K_{pk}$ represents the peak VCO gain at $v_{OFF}$ and $K_1$ describes the droop in the curve.

The nonlinear behavior of the VCO limits the usefulness for direct phase/frequency and two-point modulation architectures. Although the PLL removes some of the distortion generated by the VCO response, the distortion becomes untenable for wideband modulation. Fortunately, the system shown in FIG. 11 improves the VCO linearity. It aligns the midpoint of the signal $v_{FM}$ to the peak VCO gain $K_{pk}$, shifting $v_{FM}$ by the appropriate offset level $v_{OFF}$ with;

$$v_{MOD} = \alpha v_{FM} + v_{OFF}$$

as shown. It also introduces a scaling parameter $\alpha$ to compensate for variations in the VCO gain $K_{FM}$.

The offset level $v_{OFF}$ can be determined by using a few different methods. One method uses the calibration system shown in FIG. 12. It disables the PLL feedback loop by setting the $v_{ctrl}$ input to a fixed level $V_{set}$. (Connecting the VCO's $v_{ctrl}$ input to a fixed level breaks the PLL feedback loop and allows the VCO to free run to a frequency that depends only on $v_{FM}$.) The system steps the FM level $v_{FM}$ and measures the frequency step $\Delta f$ until it finds the largest frequency step. (The parabolic shape of the VCO gain $K_{FM}$ curve allows use of a simple algorithm—such as a binary search routine.) The largest frequency step $\max(\Delta f)$ occurs at the peak VCO gain $K_{pk}$ where $v_{FM}$ corresponds to the proper offset level $v_{OFF}$. It follows that the peak VCO gain $K_{pk}$ ca be expressed as;

$$K_{pk} = \frac{\max(\Delta f)}{\Delta v_{FM}}$$

The parameter a then becomes approximately equal to;

$$\alpha = \frac{K_{FM(ideal)}}{K_{pk}}$$

where $K_{FM(ideal)}$ is the desired VCO gain with;

$$FMf_{REF} = K_{FM(ideal)} v_{mod} d = \alpha K_{FM} v_{mod}$$

In practice, the droop in the VCO gain curve actually reduces the effective $K_{FM}$ value since;

$$K_{FM(eff)} = \Sigma K_{FM}(v_{mod}) p(v_{mod})$$

where $p(\cdot)$ is the probability associated with the FM signal $v_{mod}$. As such, it is better to evaluate the VCO gain at levels near the mean of the FM signal $v_{mod}$, with;

$$\alpha = \frac{K_{FM(ideal)}}{K_{FM}|_{mean(v_{mod})}}$$

The calibration system counts the number of VCO cycles N (measured by the extended N counter) in a fixed time period (set by $R/f_{REF}$) with;

$$f_{VCO} = \frac{N}{R} f_{REF}$$

where R is the number of cycles of the reference signal. A zero-phase restart signal initiates the reference (R) and extended PLL feedback (N) counters at the same time. The accuracy of the frequency measurement depends on the system's ability to read the N counter at precisely time T. Fortunately, simply increasing the fixed time period T reduces any read errors.

The initial calibration operates with the PLL feedback loop disabled. It nominally sets both the offset level $v_{OFF}$ and scaling parameter $\alpha$. The offset level remains fairly constant since MOSFET device capacitances $C_{min}$ and $C_{max}$, vary little with operating conditions. However, the value of the scaling parameter $\alpha$ varies with the circuit parameters and even the oscillation frequency of the VCO—as explained below. The VCO oscillates at the resonant frequency of the LC tank given by;

$$f_{osc} = \frac{1}{2\pi\sqrt{(L_1+L_2)(C_T+\Delta C)}} = f_c + \Delta f$$

where $C_T$ is the total tank capacitance less the variable capacitance $\Delta C$. The frequency step $\Delta f$ due to a change in the MOSFET capacitance AC is approximately equal to;

$$\Delta f = f_C\left[1 - \frac{1}{2}\frac{\Delta C}{C_T} + \frac{3}{8}\left(\frac{\Delta C}{C_T}\right)^2\right]$$

for small values of $\Delta C$. This simplifies to;

$$\Delta f = f_C\left(-\frac{1}{2}\frac{\Delta c}{C_T}\right)$$

which can then be rewritten as;

$$\Delta f = 2\pi^2 L f_C^3 \Delta C$$

showing that $\Delta f$ changes as the third power of $f_C$. Consequently, setting the parameter $\alpha$ and the VCO gain $K_{FM}$ accurately is a challenging task.

It is possible to track any VCO gain errors due to improper a values using the correlator network shown in FIG. 13. It computes the projection of the correction signal $v_{ctrl}$ onto the reference signal $V_{FM}$ given by;

$$v_{corr} = \int_T v_{ctrl} \times v_{FM}$$

as seen at the output of the integrator. The integrator helps reduce the effects of noise and includes a periodic reset to prevent the build-up of errors. An analog window comparator determines the sense of the VCO gain error (and ultimately scaling parameter a).

The system shown in FIG. 14a uses the correlator network to track the frequency error signal $v_{ctrl}$ and properly adjust the VCO gain in the direct phase/frequency modulator. The PLL feedback drives the VCO to produce an output where;

$$f_{VCO} = Nf_{REF} + FM f_{REF} \text{ and } f_{VCO} = K_{VCO} v_{ctrl} + \alpha K_{FM} v_{FM}$$

Setting these two expressions equal and realizing that $Nf_{REF}$ corresponds to the radio channel yields;

$$v_{ctrl} = \frac{1}{K_{VCO}}(FMf_{REF} - \alpha K_{FM} v_{mod}) + v_{DC}$$

where $v_{DC}$ is the constant part of $v_{ctrl}$. This expression shows that the error term in parentheses moves in same direction as the FM data when the equivalent VCO gain $\alpha K_{FM}$ is set low, Similarly, the error term moves in the opposite direction of the FM data when the equivalent VCO gain $\alpha K_{FM}$ is set high.

The correlator responds like a simple analog multiplier. As such, it is desirable to remove or at least greatly reduce the constant term $v_{DC}$ from the correction signal $V_{ctrl}$. Otherwise, the ref signal $v_{FM}$ leaks to the correlator's output and degrades the result. This can be accomplished using a dc blocking capacitor, a high-pass filter, or auto-zero'ed correlator. The FM tracking loop comprises logic that generates a first control signal ($V_{off}$) and a second control signal ($\alpha$). In an embodiment, the logic comprises counters, registers, or other logic suitable to increment or decrement based on the up/down signal received from the window comparator. The logic generates the control signal ($V_{off}$) to adjust the offset of a signal applied to the VCO. The logic generates the control signal ($\alpha$) to scale the signal applied to the VCO.

FIG. 14b illustrates the signals produced when the equivalent VCO gain $\alpha K_{FM}$ is low. Identical sinusoidal signals are applied to the VCO modulation port ($v_{mod}$) and the $\Delta\Sigma$ modulator input (FM). Ideally, the feedback counter tracks and thereby removes the direct frequency modulation. However, the low equivalent VCO gain $\alpha K_{FM}$ produces a phase error $\Delta\phi$ that's detected by the phase/frequency detector (P/FD). This in turn directs the charge pump (CP) to produce current pulses that feed the integration filter and produce the correction signal $v_{ctrl}$. As expected, the low equivalent VCO gain $\alpha K_{FM}$ produces a correction signal $v_{ctrl}$ that follows the applied $v_{FM}$ signal.

The FM signal $v_{FM}$ and correction signal $v_{ctrl}$ for a few different values of scaling parameter a are shown in FIG. 14c. An intentional mismatch in the peak VCO gain $K_{pk}$ and the droop in the $K_{FM}$ curve pushes the correct value for a slightly above 1.10. FIG. 14d shows that the system follows a linear response and therefore always converges to the correct $\alpha$ value.

It is also possible to refine the offset level $V_{OFF}$ during the calibration of $\alpha$. This is accomplished by separately observing the positive and negative peak FM deviations. If these differ, then the offset level needs to shift.

A variation of the $K_{FM}$ tracking system is shown in FIG. 15. It uses an A/D converter to measure the output of the correlator. This provides a direct measure of the VCO gain error and potentially a faster, more accurate $K_{FM}$ tracking loop. The FM tracking loop comprises logic that generates a first control signal ($V_{off}$) and a second control signal (a). In an embodiment, the logic comprises counters, registers, or other logic suitable to increment or decrement based on the output signal received from the A/D. The logic generates the control signal ($V_{off}$) to adjust the offset of a signal applied to the VCO. The logic generates the control signal ($\alpha$) to scale the signal applied to the VCO.

As mentioned earlier, the scaling parameter $\alpha$ depends on the VCO's circuit elements and its operating frequency ($f_c$) But it also depends on the FM data applied to the two-point phase/frequency modulator. That's because the FM data maps to the VCO, which displays a curved $K_{FM}$ response that droops at larger FM signals $v_{FM}$. As a result, the effective $K_{FM}$ depends on the distribution of the FM data and the $K_{FM}$ curvature. This is approximately equal to;

$$\langle K_{FM} \rangle = \frac{1}{N} \sum_N K_{FM}(v_{MOD})$$

where <$K_{FM}$> represents the ensemble average of the function $K_{FM}$, which varies with the adjusted FM signal $v_{MOD}$ applied to the VCO. Fortunately, the $K_{FM}$ tracking system shown in FIG. 14a properly adjusts the scaling parameter $\alpha$ in real time—that is, as the FM data drives the VCO.

The $K_{FM}$ tracking system also compensates for changes in the VCO curve, in particular, the $K_{FM}$ droop. This is important because the droop and the peak VCO gain $K_{pk}$ both increase as the VCO amplitude decreases. In addition, circuit changes may also affect the droop in the $K_{FM}$ curve. Fortunately, the tracking system resolves changes in the droop as well as other parameters and adjusts the parameter $\alpha$ accordingly as illustrated by FIG. 16.

FIG. 17 shows the operation of the tracking system with WCDMA RCC1 FM data applied. The effects of low and high a values are shown in FIGS. 17a and 17b respectively. As with the sinusoidal FM signal, the system displays a linear response in FIG. 17c which ensures convergence to the optimum a value.

FIGS. 18a-c illustrate the operation of the tracking system with WCDMA RCC3 high-speed FM data applied. As with the previous example, the behavior is predicted and the convergence is guaranteed. Notice in FIG. 18c that the higher-amplitude RCC3 FM data shifts the scaling factor as compared to the RCC1 FM data.

In one or more embodiments, the described closed-loop system advantageously tracks real-time errors in the two-point frequency modulator. The system provides methods and apparatus to compensate for various changes in the VCO amplitude, temperature shifts, and the distribution of the FM signal as it affects the VCO gain $K_{FM}$. As such, the system effectively addresses issues associated with two-point phase/frequency modulation systems. It should be noted that embodiments of the system are suitable for implementation using analog and digital technology including implementations in discrete hardware, gate arrays, programmable logic or other hardware implementations. The system is also suitable for implementations in software, for example, a computer program comprising program instructions that are executed by one or more processors.

The foregoing description, for purposes of explanation, used specific nomenclature to provide a thorough understanding of the invention. However, it will be apparent to one skilled in the art that the specific details are not required in order to practice the invention. In other instances, well-known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the following Claims and their equivalents define the scope of the invention.

What is claimed is:

1. Apparatus providing a phase/frequency modulation system, the apparatus comprising:
   a first circuit configured to introduce an offset to center a signal applied to a VCO;
   a second circuit configured to set a gain of the VCO; and
   a frequency tracking network configured to dynamically adjust one or both of the offset and the gain.

2. The apparatus of claim 1 wherein the frequency tracking network includes a correlator network operative to track a frequency error signal applied to the VCO.

3. The apparatus of claim 2 wherein the correlator network includes:
   a correlator;

an integrator coupled to an output of the correlator; and
a window comparator coupled to an output of the integrator.

4. Apparatus for tracking in a two point phase/frequency modulation system to adjust an offset and scale of a signal applied to a VCO of a phase-locked loop (PLL), the apparatus comprising:
   a correlator configured to project a PLL correction signal onto a reference modulation signal;
   an integrator for accumulating an output of the correlator;
   a window comparator for determining a polarity of an output of the integrator; and
   logic comprising a first counter configured to scale the signal applied to the VCO based on an output of the window comparator, and a second counter configured to offset the signal applied to the VCO based on the output of the window comparator.

5. Apparatus for tracking in a two point phase/frequency modulation system to adjust an offset and scale of a signal applied to a VCO, the apparatus comprising:
   a correlator operative to project a PLL correction signal onto a reference modulation signal and produce a correlation signal;
   an A/D converter for producing a digital signal based upon the correlation signal; and
   logic configured to compute a system error and to generate, based on the digital signal, a first output used in offsetting the signal applied to the VCO and a second output used in scaling the signal applied to the VCO.

6. A phase/frequency modulation system, comprising:
   a phase-locked loop (PLL) having a VCO including a first port and a second port wherein during operation of the PLL an error signal is received by the first port;
   a correlator network configured to track the error signal and produce an output signal; and
   a tracking loop which generates, in response to the output signal, a VCO control signal applied to the second port.

7. The system of claim 6 wherein the tracking loop includes:
   logic configured to generate an offset adjustment signal and a gain adjustment signal, and
   a tracking network for providing the VCO control signal based upon the offset adjustment signal and the gain adjustment signal.

* * * * *